(12) United States Patent
Chu et al.

(10) Patent No.: US 11,171,023 B2
(45) Date of Patent: Nov. 9, 2021

(54) DIODE LASER FOR WAFER HEATING FOR EPI PROCESSES

(71) Applicant: Applied Materials, Inc., Santa Clara, CA (US)

(72) Inventors: Schubert S. Chu, San Francisco, CA (US); Douglas E. Holmgren, Portland, OR (US); Kartik Shah, Sunnyvale, CA (US); Palamurali Gajendra, Bangalore (IN); Nyi O. Myo, San Jose, CA (US); Preetham Rao, Bangalore (IN); Kevin Joseph Bautista, San Jose, CA (US); Zhiyuan Ye, San Jose, CA (US); Martin A. Hilkene, Gilroy, CA (US); Errol Antonio C. Sanchez, Tracy, CA (US); Richard O. Collins, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 593 days.

(21) Appl. No.: 15/288,404

(22) Filed: Oct. 7, 2016

(65) Prior Publication Data

US 2017/0103907 A1    Apr. 13, 2017

Related U.S. Application Data

(60) Provisional application No. 62/262,980, filed on Dec. 4, 2015.

(30) Foreign Application Priority Data

Oct. 9, 2015   (IN) .......................... 5420/CHE/2015

(51) Int. Cl.
*H01L 21/67* (2006.01)
*H01L 21/268* (2006.01)
(Continued)

(52) U.S. Cl.
CPC ...... *H01L 21/67115* (2013.01); *H01L 21/268* (2013.01); *H01L 21/324* (2013.01); *H01L 21/68764* (2013.01)

(58) Field of Classification Search
CPC ................. H01L 21/268; H01L 21/324; H01L 21/67115; H01L 21/68764
(Continued)

(56) References Cited

U.S. PATENT DOCUMENTS 4,573,791 A * 3/1986 Phillips ..................... G03F 9/70
                                                    355/43
4,581,520 A * 4/1986 Vu ............................. C30B 1/02
                                                   219/405
(Continued)

FOREIGN PATENT DOCUMENTS

CN    104246981 A    12/2014
JP    2010-536161 A  11/2010
(Continued)

OTHER PUBLICATIONS

PCT Notification of Transmittal of the International Search Report and the Written Opinion of the International Searching Authority for International Application No. PCT/US2016/056111; dated Jan. 6, 2017; 14 total pages.
(Continued)

*Primary Examiner* — Ibrahime A Abraham
*Assistant Examiner* — Frederick F Calvetti
(74) *Attorney, Agent, or Firm* — Patterson & Sheridan, LLP

(57) ABSTRACT

Embodiments of the present disclosure generally relate to apparatus and methods for semiconductor processing, more particularly, to a thermal process chamber. The thermal process chamber may include a substrate support, a first plurality of heating elements disposed over the substrate
(Continued)

support, and one or more high-energy radiant source assemblies disposed over the first plurality of heating elements. The one or more high-energy radiant source assemblies are utilized to provide local heating of cold regions on a substrate disposed on the substrate support during processing. Localized heating of the substrate improves temperature profile, which in turn improves deposition uniformity.

20 Claims, 10 Drawing Sheets

(51) Int. Cl.
 *H01L 21/324* (2006.01)
 *H01L 21/687* (2006.01)
(58) Field of Classification Search
 USPC .................. 392/416–425; 118/724; 438/758
 See application file for complete search history.

(56) References Cited

U.S. PATENT DOCUMENTS

| | | | | |
|---|---|---|---|---|
| 5,399,523 A * | 3/1995 | Kakoschke | ......... | H01L 21/2686 257/E21.349 |
| 5,407,119 A * | 4/1995 | Churchill | ............. | B23K 1/0056 219/121.64 |
| 5,874,711 A * | 2/1999 | Champetier | .......... | G01J 5/0003 219/497 |
| 6,027,244 A * | 2/2000 | Champetier | ...... | H01L 21/67115 219/405 |
| 6,197,117 B1 | 3/2001 | Li et al. | | |
| 6,310,327 B1 * | 10/2001 | Moore | ................ | C23C 16/4404 118/724 |
| 6,393,210 B1 * | 5/2002 | Wu | ................... | H01L 21/67115 118/724 |
| 6,531,681 B1 * | 3/2003 | Markle | ............. | B23K 26/0738 219/121.73 |
| 6,717,158 B1 * | 4/2004 | Gat | ........................... | F27B 5/14 250/492.2 |
| 6,771,895 B2 * | 8/2004 | Gat | ...................... | F27B 17/0025 392/416 |
| 7,129,440 B2 * | 10/2006 | Adams | .................. | G02B 6/003 219/121.65 |
| 7,135,392 B1 * | 11/2006 | Adams | ............... | B23K 26/0604 438/513 |
| 7,608,802 B2 * | 10/2009 | Gat | ........................... | F27B 5/04 219/390 |
| 7,949,237 B2 * | 5/2011 | Koren | .................. | C23C 16/481 118/724 |
| 8,138,451 B2 * | 3/2012 | Gat | ........................... | F27B 5/04 118/50.1 |
| 8,249,436 B2 | 8/2012 | Aderhold et al. | | |
| 8,288,683 B2 * | 10/2012 | Jennings | ............ | B23K 26/0613 117/204 |
| 8,624,165 B2 * | 1/2014 | Kusuda | ............. | H01L 21/67115 118/50.1 |
| 8,724,977 B2 | 5/2014 | Aderhold et al. | | |
| 8,726,837 B2 | 5/2014 | Patalay et al. | | |
| 9,180,550 B2 * | 11/2015 | Kusuda | ................. | H01L 21/324 |
| 9,263,265 B2 * | 2/2016 | Sharma | ............. | H01L 21/67248 |
| 9,653,340 B2 * | 5/2017 | Boguslavskiy | ... | H01L 21/67109 |
| 9,728,471 B2 | 8/2017 | Aderhold et al. | | |
| 2003/0022471 A1 * | 1/2003 | Taketomi | ........... | H01L 21/2026 438/496 |
| 2004/0188396 A1 * | 9/2004 | Talwar | ................ | B23K 26/032 219/121.65 |
| 2005/0088636 A1 * | 4/2005 | Kurosawa | ............ | G03F 9/7026 355/53 |
| 2005/0134834 A1 * | 6/2005 | Davis | ................. | G01N 21/8851 356/72 |
| 2006/0228897 A1 * | 10/2006 | Timans | ............. | H01L 21/67115 438/758 |
| 2008/0017117 A1 * | 1/2008 | Campbell | ........... | C23C 16/4584 118/729 |
| 2009/0152247 A1 * | 6/2009 | Jennings | ............ | B23K 26/0613 219/121.61 |
| 2009/0272719 A1 * | 11/2009 | Collins | ............. | H01L 21/67259 216/58 |
| 2010/0018960 A1 | 1/2010 | Gat et al. | | |
| 2010/0054720 A1 * | 3/2010 | Hunter | .............. | H01L 21/67115 392/416 |
| 2010/0065547 A1 * | 3/2010 | Moffatt | ............. | H01L 21/67115 219/475 |
| 2010/0099268 A1 * | 4/2010 | Timans | ............. | H01L 21/67115 438/761 |
| 2011/0185969 A1 | 8/2011 | Yang | | |
| 2011/0209660 A1 | 9/2011 | Myo et al. | | |
| 2012/0067864 A1 * | 3/2012 | Kusuda | ............. | H01L 21/67115 219/385 |
| 2012/0067894 A1 | 3/2012 | Ferrandez et al. | | |
| 2012/0208377 A1 * | 8/2012 | Timans | ............. | H01L 21/67115 438/799 |
| 2012/0304926 A1 * | 12/2012 | Boguslavskiy | ... | H01L 21/67109 118/696 |
| 2013/0065403 A1 * | 3/2013 | Paranjpe | ............. | C23C 16/4584 438/758 |
| 2013/0152859 A1 | 6/2013 | Collins et al. | | |
| 2014/0246422 A1 * | 9/2014 | Koren | ..................... | C30B 31/12 219/494 |
| 2014/0273416 A1 | 9/2014 | Moffatt | | |
| 2015/0050753 A1 * | 2/2015 | Srinivasan | ........ | H01L 21/67115 438/5 |
| 2015/0064933 A1 * | 3/2015 | Sharma | ............. | H01L 21/67115 438/795 |
| 2015/0200081 A1 | 7/2015 | Nakayama | | |
| 2016/0071745 A1 * | 3/2016 | Kim | ................... | H01L 21/67115 134/105 |
| 2016/0284575 A1 * | 9/2016 | Ito | ........................ | H01L 21/677 |
| 2017/0032865 A1 * | 2/2017 | Ranish | ............. | H01L 21/67103 |
| 2018/0311764 A1 * | 11/2018 | Kim | ................... | H01L 21/67028 |

FOREIGN PATENT DOCUMENTS

| | | |
|---|---|---|
| JP | 2013-514673 A | 4/2013 |
| WO | 2009/019642 A2 | 2/2009 |
| WO | 2011/084575 A2 | 7/2011 |

OTHER PUBLICATIONS

Walker, et al.; Materials Science and Engineering; Novel High Temperature Metal Organic Chemical Vapor Deposition Vertical Rotating-Disk Reactor With Multizone Heating for GaN and Related Materials; dated 1995; 5 total pages.

Taiwanese Office Action (with attached English translation of the Search Report) for Application No. 105132553; dated Mar. 29, 2019; 7 total pages.

European Patent Office; Extended Search Report for Application No. 16854479.9; dated May 14, 2019; 10 total pages.

Taiwan Office Action dated Aug. 6, 2020 for Application No. 109108721.

Japanese Office Action dated Sep. 23, 2020 for Application No. 2018-517773.

Chinese Office Action dated Jul. 9, 2021, for Chinese Patent Application No. 201680056747.6.

* cited by examiner

DIODE LASER FOR WAFER HEATING FOR EPI PROCESSES

CLAIM OF PRIORITY

This application claims priority to Indian Patent Application No. 5420/CHE/2015, filed on Oct. 9, 2015, and U.S. Provisional Patent Application Ser. No. 62/262,980, filed on Dec. 4, 2015, which herein are incorporated by reference.

BACKGROUND

Field

Embodiments of the present disclosure generally relate to apparatus and methods for semiconductor processing, more particularly, to a thermal process chamber.

Description of the Related Art

Semiconductor substrates are processed for a wide variety of applications, including the fabrication of integrated devices and microdevices. During processing, the substrate is positioned on a susceptor within a process chamber. The susceptor is supported by a support shaft, which is rotatable about a central axis. Precise control over a heating source, such as a plurality of heating lamps disposed below and above the substrate, allows the substrate to be heated within very strict tolerances. The temperature of the substrate can affect the uniformity of the material deposited on the substrate.

Despite the precise control of heating the substrate, it has been observed that valleys (lower deposition) are formed at certain locations on the substrate. Therefore, a need exists for an improved thermal process chamber in semiconductor processing.

SUMMARY

Embodiments of the present disclosure generally relate to apparatus and methods for semiconductor processing, more particularly, to a thermal process chamber. In one embodiment, a process chamber includes a first dome, a second dome, a substrate support disposed between the first dome and the second dome, a first plurality of heating elements disposed over the first dome, wherein the first dome is disposed between the first plurality of heating elements and the substrate support, and a high-energy radiant source assembly disposed over the first plurality of heating elements, wherein the high-energy radiant source assembly comprises a high-energy radiant source having a total output power of at least 100 W.

In another embodiment, a process chamber includes a first dome, a second dome, a substrate support disposed between the first dome and the second dome, a first plurality of heating elements disposed over the first dome, wherein the first dome is disposed between the first plurality of heating elements and the substrate support, a support member disposed over the first plurality of heating elements, wherein the first plurality of heating elements are disposed between the first dome and the support member, and a first high-energy radiant source assembly disposed on the support member, wherein the high-energy radiant source assembly comprises a high-energy radiant source and a bracket for coupling the high-energy radiant source assembly to the support member.

In another embodiment, a process chamber includes a first dome, a second dome, a substrate support disposed between the first dome and the second dome, a plurality of heating elements disposed over the first dome, wherein the first dome is disposed between the plurality of heating elements and the substrate support, a support member disposed over the first plurality of heating elements, wherein the first plurality of heating elements are disposed between the first dome and the support member, and a high-energy radiant source assembly movably disposed on a track formed on the support member, wherein the high-energy radiant source assembly comprises a high-energy radiant source.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Embodiments of the present disclosure generally relate to apparatus and methods for semiconductor processing, more particularly, to a thermal process chamber. The thermal process chamber may include a substrate support, a first plurality of heating elements disposed over the substrate support, and one or more high-energy radiant source assemblies disposed over the first plurality of heating elements. The one or more high-energy radiant source assemblies are utilized to provide local heating of cold regions on a substrate disposed on the substrate support during processing. Localized heating of the substrate improves temperature profile, which in turn improves deposition uniformity.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The substrate itself is not limited to any particular size or shape. Although the embodiments described herein are made with generally made with reference to a round 200 mm or 300 mm substrate, other shapes, such as polygonal, squared, rectangular, curved, or otherwise non-circular workpieces may be utilized according to the embodiments described herein.

Figure 1:
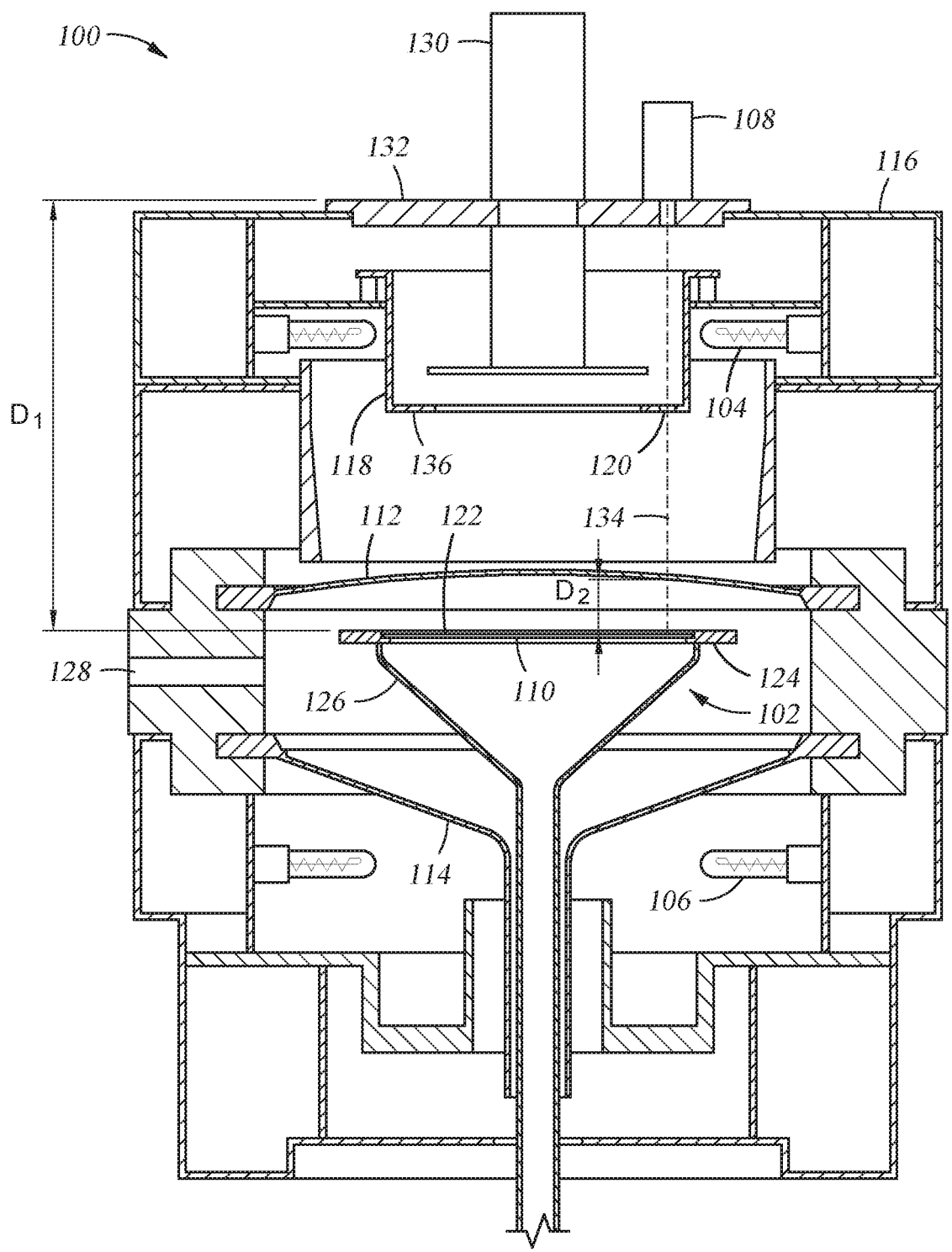
FIG. 1 is a schematic cross sectional side view of a process chamber according to one embodiment.

FIG. 1 is a schematic cross sectional side view of a process chamber 100 according to one embodiment. The process chamber 100 may be a process chamber for performing any thermal process, such as an epitaxial process. It is contemplated that while a process chamber for epitaxial process is shown and described, the concept of the present disclosure is also applicable to other process chamber that is capable of providing a controlled thermal cycle that heats the substrate for processes such as, for example, thermal annealing, thermal cleaning, thermal chemical vapor deposition, thermal oxidation and thermal nitridation, regardless of whether the heating elements are provided at the top, bottom, or both of the process chamber.

The process chamber 100 may be used to process one or more substrates, including the deposition of a material on a deposition surface 122 of a substrate 110. The process chamber 100 may include a first dome 112, a second dome 114, and a substrate support 102 disposed between the first dome 112 and the second dome 114. The substrate support 102 may include a susceptor 124 for supporting the substrate 110 and a susceptor support 126 for supporting the susceptor 124. The first dome 112 and the second dome 114 may be constructed from an optically transparent material, such as quartz. The substrate 110 can be brought into the process chamber 100 through a loading port 128 and positioned on the susceptor 124. The susceptor 124 may be made of SiC coated graphite. The susceptor support 126 may be rotated by a motor (not shown), which in turn rotates the susceptor 124 and the substrate 110.

The process chamber 100 may further include a first plurality of heating elements 106, such as radiant heating lamps, disposed below the second dome 114 for heating the substrate 110 from below the substrate 110. The process chamber 100 may also include a second plurality of heating elements 104, such as radiant heating lamps, disposed over the first dome 112 for heating the substrate 110 from above the substrate 110. In one embodiment, the first and second plurality of heating elements 104, 106 provide infrared radiant heat to the substrate though the first dome 112 and the second dome 114, respectively. The first and second domes 112, 114 may be transparent to the infrared radiation, defined as transmitting at least 95% of infrared radiation.

In one embodiment, the process chamber 100 may also include one or more temperature sensors 130, such as optical pyrometers, which measure temperatures within the process chamber 100 and on the surface 122 of the substrate 110.

The one or more temperature sensors 130 may be disposed on a support member 132 that is disposed on a lid 116. A reflector 118 may be placed outside the first dome 112 to reflect infrared light radiating from the substrate 110 and the first dome 112 back towards the substrate 110. One or more high-energy radiant source assemblies 108, such as focused high-energy radiant source assemblies, for example laser source assemblies, may be disposed on the support member 132. The one or more high-energy radiant source assemblies 108 may produce one or more high-energy radiant beams 134, such as focused high-energy radiant beams, for example laser beams, which form a beam spot on the surface 122 of the substrate 110 in order to perform localized heating of the substrate 110. The one or more high-energy radiant beams 134 may go through an opening 120 formed in an annular portion 136 of the reflector 118, and the first dome 112 may be transparent to the high-energy radiant beams (transmitting at least 95% of the radiation of the high-energy radiant beam 134). In one embodiment, the distance $D_1$ one high-energy radiant beam 134 of the one or more beams 134 travels from a lens (FIG. 3) to the surface 122 of the substrate 110 is about 400 mm, and the distance $D_2$ the one high-energy radiant beam 134 of the one or more beams 134 travels from the first dome 112 to the surface 122 of the substrate 110 is about 76 mm.

During operation, such as an epitaxial deposition, the substrate 110 may be heated to a predetermined temperature, such as less than about 750 degrees Celsius. Despite the precise control of heating the substrate 110, one or more regions on the substrate 110 may experience temperature non-uniformity, such as about 2-5 degrees Celsius lower than rest of the substrate 110. The temperature non-uniformity leads to film thickness non-uniformity, such as thickness non-uniformity of one percent or more, for a film deposited on the substrate in the one or more regions. In order to improve temperature uniformity, which in turn improves film thickness non-uniformity, the one or more high-energy radiant source assemblies 108 are used to locally heat the one or more regions on the substrate 110. Since the substrate 110 is rotating during operation, the localized heating by the one or more high-energy radiant source assemblies 108 may be over an annular region at a certain radius of the substrate 110. In one embodiment, the annular region is at about 50 mm radius. In some embodiments, the one or more high-energy radiant source assemblies 108 may be movably disposed on the support member 132, such as movably disposed on a track (FIG. 8) disposed along a radial direction on the support member 132, and the one or more high-energy radiant source assemblies 108 may be movable along the track in order to locally heat any cold regions on the substrate 110 during operation. In some embodiments, multiple high-energy radiant source assemblies 108 (FIGS. 8 and 9) are utilized to simultaneously heat multiple cold regions on the substrate 110.

Figure 2:
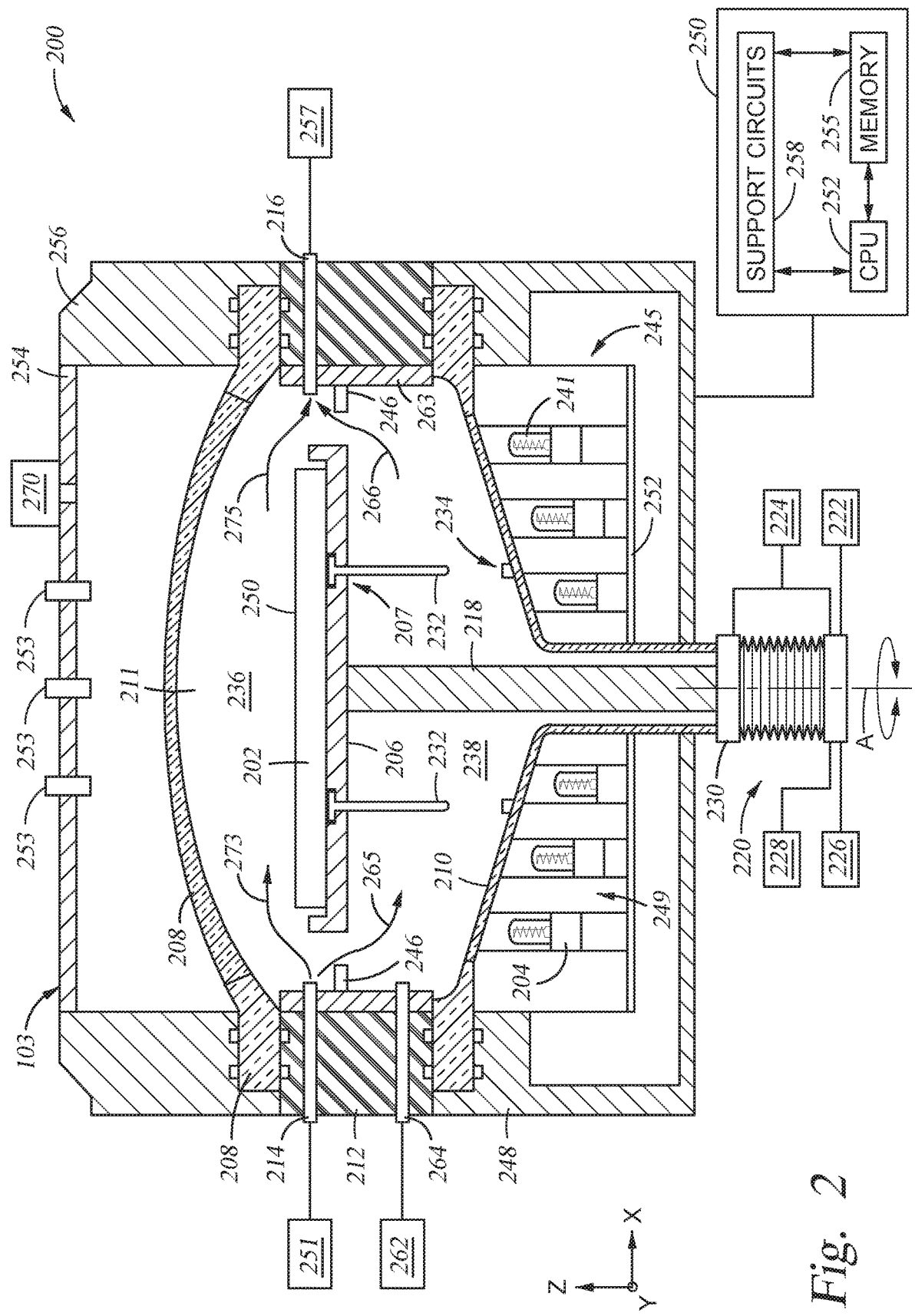
FIG. 2 is a schematic cross sectional side view of a process chamber according to another embodiment.
Figure 3:
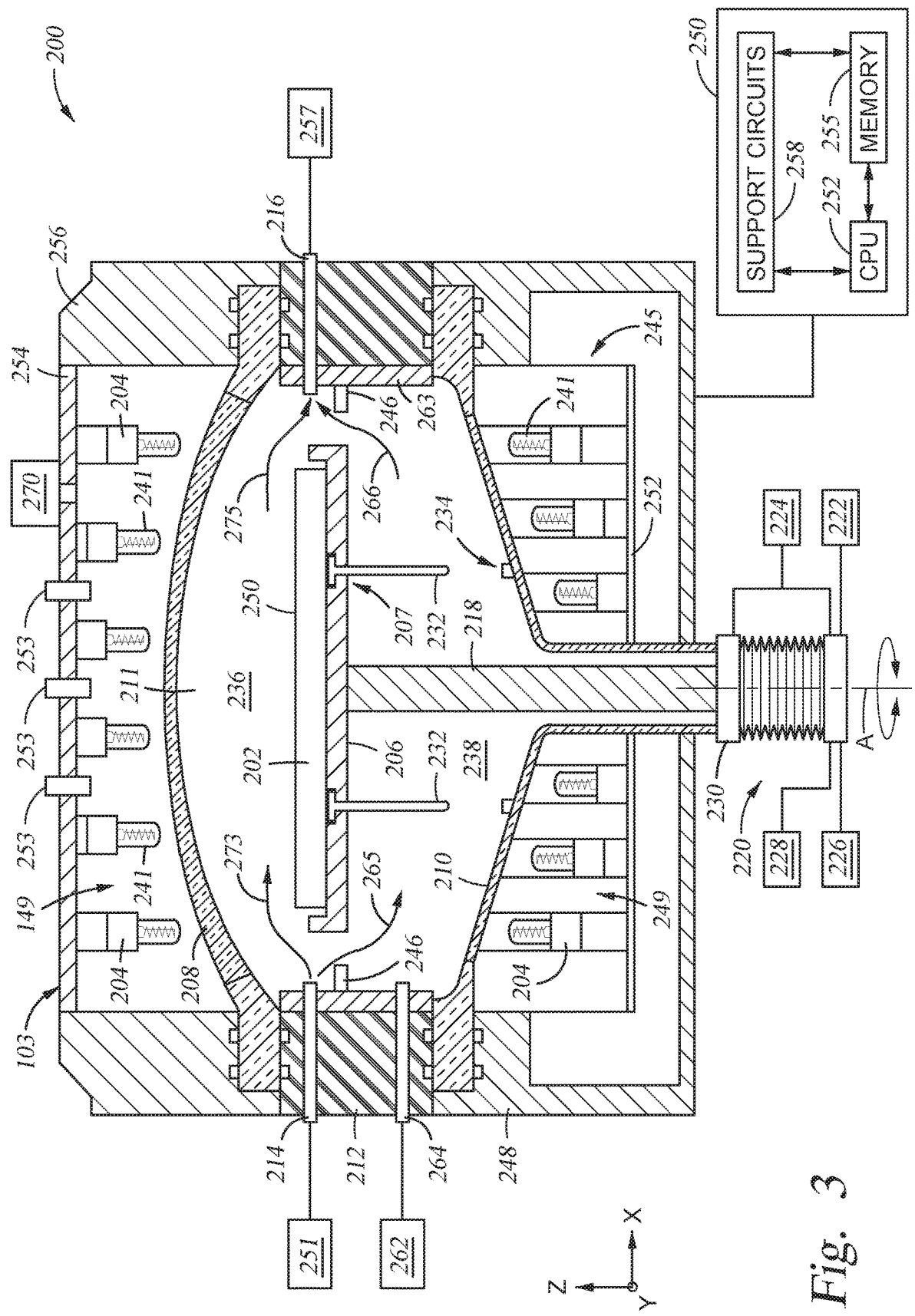
FIG. 3 is a schematic cross sectional side view of a process chamber according to another embodiment.

FIGS. 2 and 3 illustrate a schematic sectional view of a process chamber 200 according to another embodiment. The process chamber 200 may be used as an epitaxial deposition chamber, a rapid thermal process chamber, or other thermal treatment chamber. The process chamber 200 may be used to process one or more substrates, including the deposition of a material on an upper surface of a substrate 202, heating of a substrate 202, etching of a substrate 202, or combinations thereof. The process chamber 200 generally includes a chamber wall 103, and an array of radiant heating lamps 204 for heating, among other components, a susceptor 206 disposed within the process chamber 200. As shown in FIG. 2 and FIG. 3, an array of radiant heating lamps 204 may be disposed below the susceptor 206. As shown in FIG. 3, an array of radiant heating lamps 204 may be disposed below and/or above the susceptor 206. The radiant heating lamps 204 may provide a total lamp power of between about 10 KW and about 60 KW. The radiant heating lamps 204 may heat the substrate 202 to a temperature of between about 500 degrees Celsius and about 900 degrees Celsius. The susceptor 206 may be a disk-like substrate support as shown, or may include a ring-like substrate support (not shown), which supports the substrate from the edge of the substrate, which exposes a backside of the substrate 202 to heat from the radiant heating lamps 204. The susceptor 206 may be formed from silicon carbide or graphite coated with silicon carbide to absorb radiant energy from the lamps 204 and conduct the radiant energy to the substrate 202, thus heating the substrate 202.

The susceptor 206 is located within the process chamber 200 between a first transmissive member 208, which may be a dome, and a second transmissive member 210, which may be a dome. The first transmissive member 208 and the second transmissive member 210, along with a base ring 212 that is disposed between the first transmissive member 208 and second transmissive member 210, generally define an internal region 211 of the process chamber 200. Each of the first transmissive member 208 and/or the second transmissive member 210 may be convex and/or concave. In some embodiments, each of the first transmissive member 208 and/or the second transmissive member 210 may be transparent. The first transmissive member 208 may be disposed between the chamber wall 103 and the susceptor 206. In some embodiments, an array of radiant heating lamps 204 may be disposed outside of the internal region 211 of the process chamber 200 and/or above the first transmissive member 208, for example, a region 149 defined between the first transmissive member 208 and a reflector 254 (discussed infra). The substrate 202 can be transferred into the process chamber 200 and positioned onto the susceptor 206 through a loading port (not shown) formed in the base ring 212. A process gas inlet 214 and a gas outlet 216 may be provided in the base ring 212.

The susceptor 206 includes a shaft or stem 218 that is coupled to a motion assembly 220. The motion assembly 220 includes one or more actuators and/or adjustment devices that provide movement and/or adjustment of the stem 218 and/or the susceptor 206 within the internal region 211. For example, the motion assembly 220 may include a rotary actuator 222 that rotates the susceptor 206 about a longitudinal axis A of the process chamber 200. The longitudinal axis A may include a center of an X-Y plane of the process chamber 200. The motion assembly 220 may include a vertical actuator 224 to lift and lower the susceptor 206 in the Z direction. The motion assembly 220 may include a tilt adjustment device 226 that is used to adjust a planar orientation of the susceptor 206 in the internal region 211. The motion assembly 220 may also include a lateral adjustment device 228 that is utilized to adjust the positioning of the stem 218 and/or the susceptor 206 side to side within the internal region 211. In embodiments including a lateral adjustment device 228 and a tilt adjustment device 226, the lateral adjustment device 228 is utilized to adjust positioning of the stem 218 and/or the susceptor 206 in the X and/or Y direction while the tilt adjustment device 226 adjusts an angular orientation (a) of the stem 218 and/or the susceptor 206. In one embodiment, the motion assembly 220 includes a pivot mechanism 230. As the second transmissive member 210 is attached to the process chamber 200 by the base ring 212, the pivot mechanism 230 is utilized to allow the motion assembly 220 to move the stem 218 and/or the susceptor 206 at least in the angular orientation (a) to reduce stresses on the second transmissive member 210.

The susceptor 206 is shown in an elevated processing position but may be lifted or lowered vertically by the motion assembly 220 as described above. The susceptor 206 may be lowered to a transfer position (below the processing position) to allow lift pins 232 to contact the second transmissive member 210. The lift pins 232 extend through holes 207 in the susceptor 206 as the susceptor 206 is lowered, and the lift pins 232 raise the substrate 202 from the susceptor 206. A robot (not shown) may then enter the process chamber 200 to engage and remove the substrate therefrom though the loading port. A new substrate 202 may be loaded onto the lift pins 232 by the robot, and the susceptor 206 may then be actuated up to the processing position to place the substrate 202, with its device side 250 facing up. The lift pins 232 include an enlarged head allowing the lift pins 232 to be suspended in openings by the susceptor 206 in the processing position. In one embodiment, stand-offs 234 coupled to the second transmissive member 210 are utilized to provide a flat surface for the lift pins 232 to contact. The stand-offs provide one or more surfaces parallel to the X-Y plane of the process chamber 200 and may be used to prevent binding of the lift pins 232 that may occur if the end thereof is allowed to contact the curved surface of the second transmissive member 210. The stand-offs 234 may be made of an optically transparent material, such as quartz, to allow energy from the lamps 204 to pass therethrough.

The susceptor 206, while located in the processing position, divides the internal volume of the process chamber 200 into a process gas region 236 that is above the susceptor 206, and a purge gas region 238 below the susceptor 206. The susceptor 206 is rotated during processing by the rotary actuator 222 to minimize the effect of thermal and process gas flow spatial anomalies within the process chamber 200 and thus facilitates uniform processing of the substrate 202. The susceptor 206 may rotate at between about 5 RPM and about 100 RPM, for example, between about 10 RPM and about 50 RPM. The susceptor 206 is supported by the stem 218, which is generally centered on the susceptor 206 and facilitates movement of the susceptor 206 substrate 202 in a vertical direction (Z direction) during substrate transfer, and in some instances, processing of the substrate 202.

In general, the central portion of the first transmissive member 208 and the bottom of the second transmissive member 210 are formed from an optically transparent material such as quartz. The thickness and the degree of curvature of the first transmissive member 208 may be selected to provide a flatter geometry for uniform flow in the process chamber.

One or more lamps, such as an array of the radiant heating lamps 204, can be disposed adjacent to and beneath the second transmissive member 210 in a specified manner around the stem 218. The radiant heating lamps 204 may be independently controlled in zones in order to control the temperature of various regions of the substrate 202 as the process gas passes thereover, thus facilitating the deposition of a material onto the upper surface of the substrate 202. While not discussed here in detail, the deposited material may include silicon, doped silicon, germanium, doped germanium, silicon germanium, doped silicon germanium, gallium arsenide, gallium nitride, or aluminum gallium nitride.

The radiant heating lamps 204 may include a radiant heat source, depicted here as a lamp bulb 241, and may be configured to heat the substrate 202 to a temperature within a range of about 200 degrees Celsius to about 1,600 degrees Celsius. Each lamp bulb 241 can be coupled to a power distribution board, such as printed circuit board (PCB) 252, through which power is supplied to each lamp bulb 241. A standoff may be used to couple the lamp bulb 241 to the power distribution board, if desired, to change the arrangement of lamps. In one embodiment, the radiant heating lamps 204 are positioned within a lamphead 245 which may be cooled during or after processing by, for example, a cooling fluid introduced into channels 249 located between the radiant heating lamps 204.

A circular shield 246 may be optionally disposed around the susceptor 206 and coupled to a sidewall of the chamber body 248. The shield 246 prevents or minimizes leakage of heat/light noise from the lamps 204 to the device side 250 of the substrate 202 in addition to providing a pre-heat zone for the process gases. The shield 246 may be made from CVD SiC, sintered graphite coated with SiC, grown SiC, opaque quartz, coated quartz, or any similar, suitable material that is resistant to chemical breakdown by process and purge gases. In some embodiments, the shield 246 is coupled to a liner 263 disposed on the base ring 212.

Substrate temperature is measured by sensors configured to measure temperatures at the bottom of the susceptor 206. The sensors may be pyrometers (not shown) disposed in ports formed in the lamphead 245. Additionally or alternatively, one or more sensors 253, such as a pyrometer, may be directed to measure the temperature of the device side 250 of the substrate 202. A reflector 254 may be optionally placed outside the first transmissive member 208 to reflect infrared light that is radiating off the substrate 202 and redirect the energy back onto the substrate 202. The reflector 254 may be secured to the first transmissive member 208 using a clamp ring 256. The reflector 254 may be disposed adjacent the chamber wall 103. In some embodiments, the reflector may be coupled to the chamber wall 103. The reflector 254 can be made of a metal such as aluminum or stainless steel. The sensors 253 may be disposed through the reflector 254 to receive radiation from the device side 250 of the substrate 202.

Process gas supplied from a process gas supply source 251 is introduced into the process gas region 236 through the process gas inlet 214 formed in the sidewall of the base ring 212. The process gas inlet 214 is configured to direct the process gas in a generally radially inward direction. As such, in some embodiments, the process gas inlet 214 may be a cross-flow gas injector. The cross-flow gas injector is positioned to direct the process gas across a surface of the susceptor 206 and/or the substrate 202. During a film formation process, the susceptor 206 is located in the processing position, which is adjacent to and at about the same elevation as the process gas inlet 214, thus allowing the process gas to flow generally along flow path 273 across the upper surface of the susceptor 206 and/or substrate 202. The process gas exits the process gas region 236 (along flow path 275) through the gas outlet 216 located on the opposite side of the process chamber 200 as the process gas inlet 214. Removal of the process gas through the gas outlet 216 may be facilitated by a vacuum pump 257 coupled thereto.

Purge gas supplied from a purge gas source 262 is introduced to the purge gas region 238 through a purge gas inlet 264 formed in the sidewall of the base ring 212. The purge gas inlet 264 is disposed at an elevation below the process gas inlet 214. If the circular shield 246 is used, the circular shield 246 may be disposed between the process gas inlet 214 and the purge gas inlet 264. In either case, the purge gas inlet 264 is configured to direct the purge gas in a generally radially inward direction. The purge gas inlet 264 may be configured to direct the purge gas in an upward direction. During a film formation process, the susceptor 206 is located at a position such that the purge gas flows generally along flow path 265 across a back side of the susceptor 206. The purge gas exits the purge gas region 238 (along flow path 266) and is exhausted out of the process chamber through the gas outlet 216 located on the opposite side of the process chamber 200 as the purge gas inlet 264.

The process chamber 200 further includes a high-energy radiant source assembly 270, such as a focused high-energy radiant source assembly, for example a laser system assembly. The high-energy radiant source assembly 270 may be coupled to the process chamber 200. In some embodiments, the process chamber 200 may include a plurality of high-energy radiant source assemblies 270, for example two or more assemblies 270 coupled to the process chamber 200.

Figure 4:
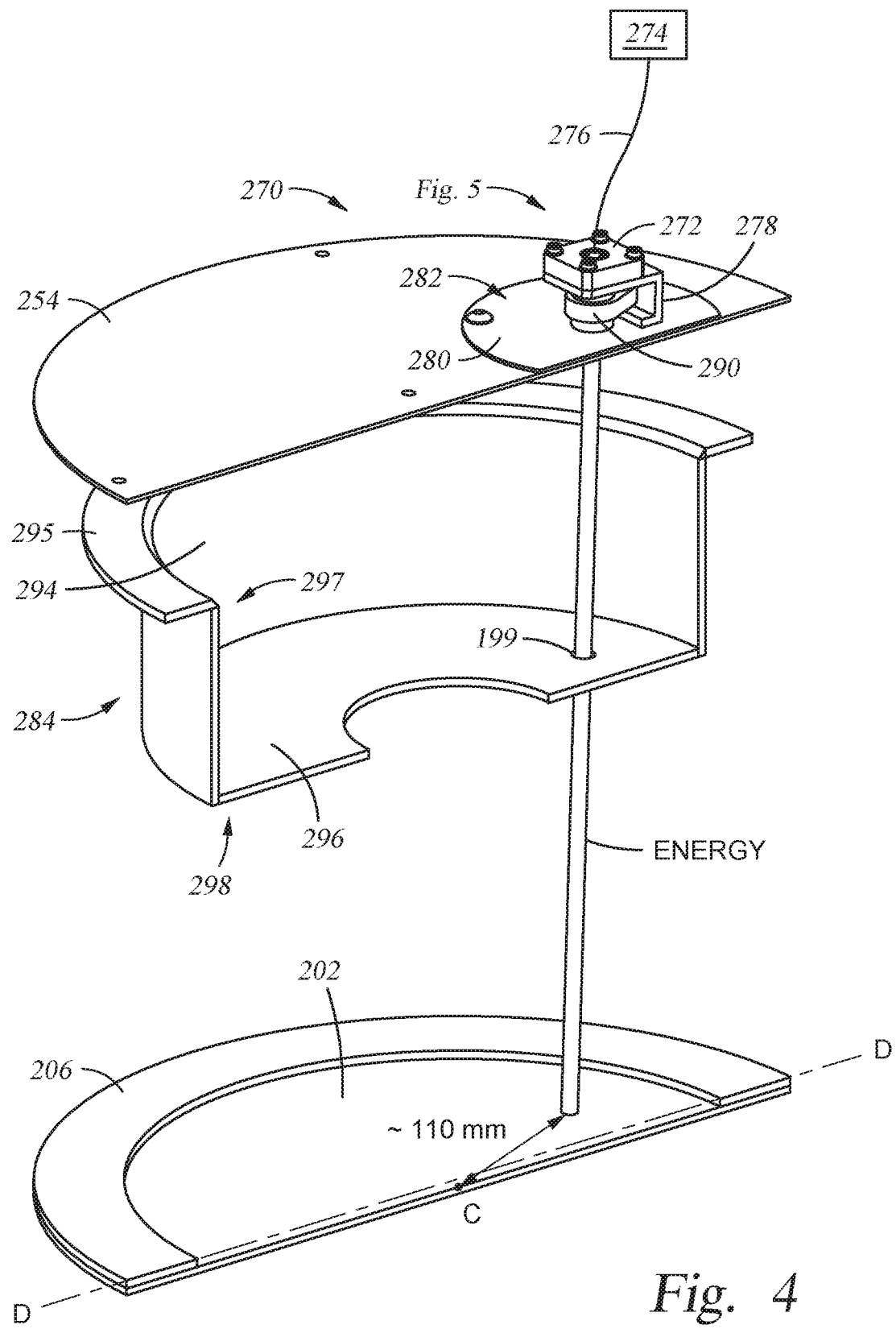
FIG. 4 is a schematic perspective view of a high-energy radiant source assembly according to embodiments described herein.

FIG. 4 schematically illustrates a perspective view of the high-energy radiant source assembly 270 of FIG. 2 and FIG. 3. The high-energy radiant source assembly 270 includes a source head 272, a source 274, and a fiber cable 276. The source 274 may be operatively connected to the source head 272 via the fiber cable 276. In some embodiments, the high-energy radiant source assembly 270 may be a laser system assembly, such as a diode laser system assembly. The fiber cable 276 may include at least one diode. In some embodiments, the fiber cable 276 may include a plurality of diodes. Furthermore, in some embodiments, the high-energy radiant source assembly 270 may include a plurality of source heads 272 operatively connected to the source 274. The plurality of source heads 272 may be operatively connected to the source 274 via one or more fiber cables 276. In some embodiments, the source head 272 may be coupled with the processing chamber 200 adjacent the upper lamp module, as shown in FIG. 2, and/or adjacent the lift pins 232. The source head 272 may secure an end of the fiber cable 276 in a fixed position such that the position of the high-energy radiant beam, such as a laser beam, is controlled.

The high-energy radiant source assembly 270 may further include a mounting bracket 278. The mounting bracket 278 may be coupled to the processing chamber 200. The source head 272 may be coupled to the mounting bracket 278. The high-energy radiant source assembly 270 may further include a cover plate 280, the reflector 254, and a reflector member 284.

The reflector 254 may be coupled to the chamber wall 103 and/or the mounting bracket 278. In some embodiments, the reflector 254 may be a circular disk; however, it is contemplated that the reflector 254 may be of any suitable shape. The reflector member 284 may be circular. The reflector member 284 may have an outer wall 294, a first edge 295, and a second edge 296. The outer wall 294, the first edge 295, and/or the second edge 296 may be circular in shape, ring like, or other suitable shapes. The first edge 295 may be disposed at a first end 297 of the reflector member 284 and the second edge 296 may disposed at a second end 298 of the reflector member 284, wherein the first edge is opposite the second edge 296. The first edge 295 and the second edge 296 may be substantially perpendicular to the outer wall 294. The second edge 296 may include at least one hole 199 bored therethrough for allowing light through the reflector member 284. The source head 272 may be positioned such that light from the source head 272 enters through the hole 199 toward the substrate 202 and/or the susceptor 206. The reflector member 284 may be coupled to the reflector 254. In some embodiments, the reflector member 284 may be coupled to the first edge 295 of the reflector member. In some embodiments, the reflector member 284 may be coupled to the reflector member 284 via a screw connection, a bolt connection, and/or any other suitable connection means.

The cover plate 280 may be a circular cover plate 280 or a disk-shaped cover plate 280; however it is contemplated that the cover plate 280 may be of any suitable shape. The cover plate 280 may have a diameter less than a diameter of the reflector 254. The cover plate 280 may be disposed between the mounting bracket 278 and the reflector 254. The cover plate 280 may be coupled to the reflector 254. In some embodiments, the cover plate 280 may be coupled to the reflector 254 with a bolted connection, a screw connection, and/or any other suitable connection means.

The high-energy radiant source assembly 270 is positioned to direct high-energy radiant beam at a region of the susceptor 206 between about 90 mm and about 130 mm, for example between about 100 mm and about 120 mm, from a central area C of the susceptor 206.

Figure 5:
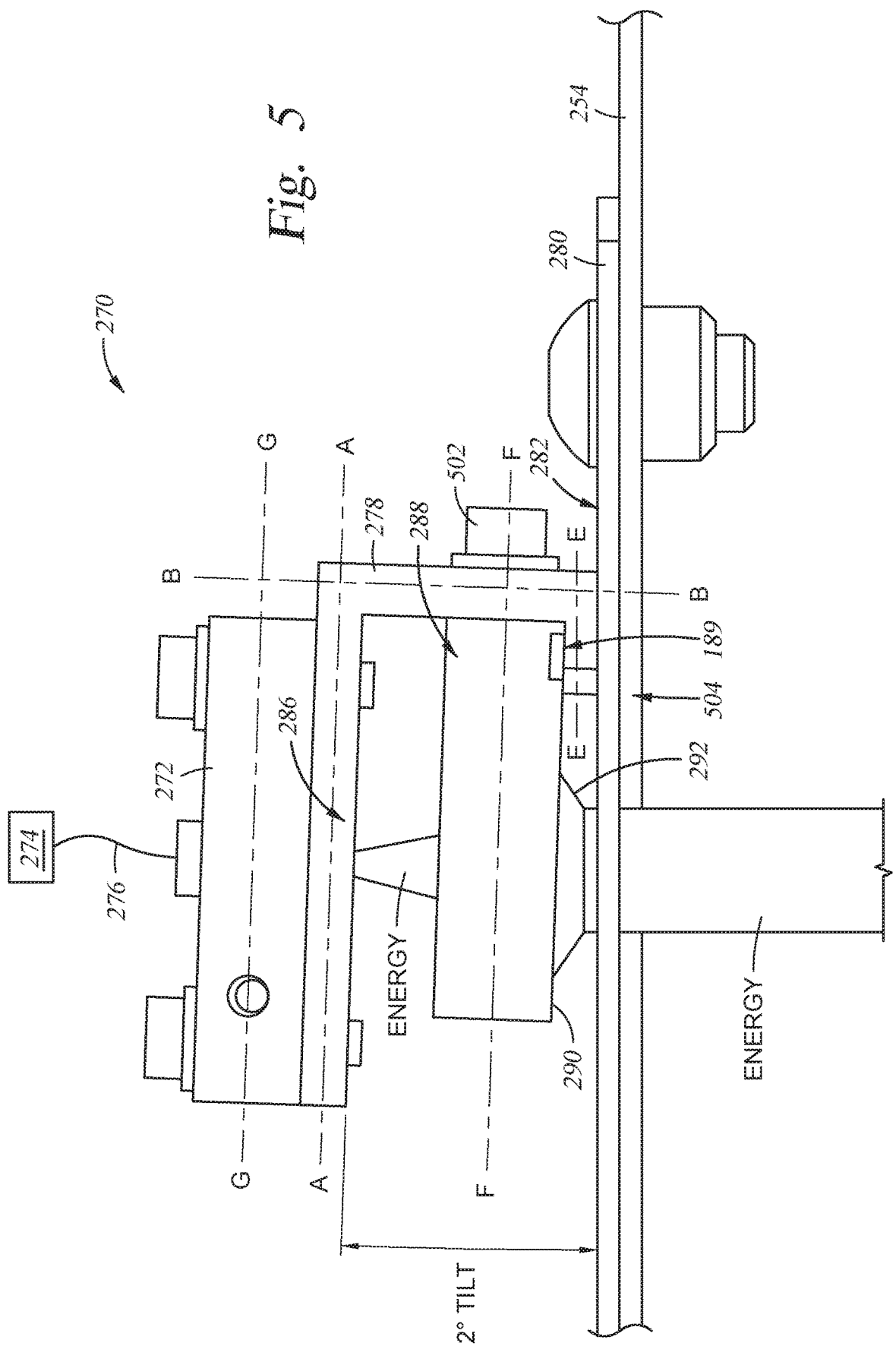
FIG. 5 is a schematic cross sectional side view of the high-energy radiant source assembly of FIG. 4 according to one embodiment.

FIG. 5 schematically illustrates an enlarged view of the high-energy radiant source assembly 270 of FIG. 4. As shown, the mounting bracket 278 may be coupled to the cover plate 280. In some embodiments, the mounting bracket 278 may be coupled to the cover plate 280 via a bolt mechanism. As shown in FIG. 5, the mounting bracket 278 is coupled from a bottom side of the mounting bracket 278 to the cover plate 280 via a fastening mechanism 504, which may include a bolt. In some embodiments, the mounting bracket 278 may be a "C" shaped mounting bracket 278 or an "L" shaped mounting bracket 278; however, it is contemplated that the mounting bracket 278 may be of any suitable shape. The mounting bracket 278 may include a first arm 286 which extends parallel to a surface of the cover plate 280, and/or a second arm 288 which extends perpendicular to a surface of the cover plate 280. The source head 272 may be coupled to the mounting bracket 278. In some embodiments, the source head 272 may be coupled to the first arm 286 of the mounting bracket 278, such that the source head 272 is raised relative to the cover plate 280.

The first arm 286 of the mounting bracket 278, which, in certain embodiments, is coupled to the source head 272, may be tilted such that the first arm 286 of the mounting bracket 278 and the second arm 288 of the mounting bracket are not perpendicular. The first arm 286 of the mounting bracket 278 may be tilted at an angle of between about −4 degrees and about 4 degrees relative to the surface 282 of the cover plate 280. For example, in some embodiments, the source head 272 may be tilted 2 degrees relative to the surface 282 of the cover plate 280 and/or the surface of the susceptor 206. The surface 282 of the cover plate 280 may be parallel to a horizontal axis D of the susceptor 206. In some embodiments, the first arm 286 of the mounting bracket 278 has a first central axis A and the second arm 288 of the mounting bracket 278 has a second central axis B. The first central axis A is not orthogonal to the second central axis B. Furthermore, in some embodiments, the susceptor 206 has a horizontal axis D. The first central axis A of the first arm 286 of the mounting bracket 278 is not parallel to the horizontal axis D of the susceptor 206.

In some embodiments, the mounting bracket 278 may include a third arm 189. The third arm 189 of the mounting bracket 278 may have a central axis E. The central axis E of the third arm 189 may be parallel to the surface 282 of the cover plate 280. The third arm 189 may be coupled to the cover plate 280. In some embodiments, the third arm 189 may be coupled to the cover plate 280 by a bolting mechanism and/or any other suitable connection mechanism. The second arm 288 of the mounting bracket 278 may be tilted, such that the central axis B of the second arm 288 is not perpendicular to the central axis E of the third arm 189. In some embodiments, the central axis B of the second arm 288 may be tilted between about −4 degrees and about 4 degrees from an axis perpendicular to the central axis E of the third arm 189. The central axis A of the first arm 286 may be perpendicular to the central axis B of the second arm.

The tilting of the of the first arm 286 of the mounting bracket 278 and the source head 272 may decrease and/or prevent back shot of the light to the laser head 272. Furthermore, tilting of the source head 272 may position the high-energy radiant source assembly 270 to direct light at a region of the susceptor 206 between about 90 mm and about 130 mm, for example between about 100 mm and about 120 mm, from the central area C of the susceptor 206. Positioning of the high-energy radiant source assembly 270 and directing light at the region of the susceptor 206 between about 90 mm and about 130 mm from the central area C of the susceptor 206 may direct the light onto an area of the susceptor 206 and/or substrate 202 that is coupled with at least one lift pin 232.

The high-energy radiant source assembly 270 may further include a lens holder 290. The lens holder 290 may be coupled to the mounting bracket 278. In some embodiments, the lens holder 290 may be coupled to the second arm 288 of the mounting bracket 278. The lens holder 290 may be coupled to the mounting bracket 278 with a bolt connection, a screw connection, and/or any other suitable connection mechanism. For example, as shown in FIG. 5, the lens holder 290 is coupled to the mounting bracket 278 with screw 502. The lens holder 290 may extend outward from the mounting bracket 278 such that the lens holder 290 is disposed between the source head 272 and the cover plate 280. The lens holder 290 may be tilted at the same angle or at an angle substantially similar to the tilt angle of the source head 272. As such, a central axis F of the lens holder 290 may be substantially parallel to a central axis G of the source head 272.

The lens holder 290 may include a lens 292. The lens 292 may be a telecentric lens. The telecentric lens 292 may defocus the light from the laser head 272 into a beam. In some embodiments, the telecentric lens 292 may collimate the light. In some embodiments, if the light has a focal point when incident on the telecentric lens 292, the light may leave the telecentric lens 292 with no focal point or a focal point at infinity. In certain embodiments, the lens 292 may focus the light from the source head 272 into a beam having a diameter of between about 2 mm and about 10 mm, for example between about 4 mm and about 8 mm. In some embodiments, the lens holder 290 may include one or more optical elements.

The source 274 may be offsite or onsite. The source may generate energy, for example light. In some embodiments, the source 274 may be a diode laser source. The diodes may be electrically pumped. Recombination of the electrons and holes created by the applied current may introduce an optical gain. Reflection from the ends of a crystal may form an optical resonator, although the resonator may be external. In some embodiments, the source 274 may be a fiber laser source. The fiber laser source may be a solid-state laser or a laser amplifier in which the light is guided due to a total internal reflection in a single mode optical fiber. The guiding of the light may allow for long gain regions. Furthermore, wave guiding properties of the fiber laser reduce thermal distortion of the light beam. Erbium and/or ytterbium ions may be active species in the fiber laser. The source 274 may provide a laser power of between about 20 watts and about 200 watts.

In some embodiments, the source 274 may be a source of laser light. As such, in certain embodiments, the fiber cable 276 may be a light pipe to transmit the laser light into the process chamber 200. Additionally, in some embodiments, the fiber cable 276 may be a single pass amplifier.

In some embodiments, the source 274 may be a source of seed photons. As such, in certain embodiments, the fiber cable 276 is a lasing medium comprising at least one diode. In some embodiments, the diode may be inside the fiber cable 276. The fiber cable 276 may be the oscillator. As such, the source 274 is a source of seed photons configured to start the stimulated emission of photons in the fiber cable 276 or in other such lasing mediums. The source 274 and the fiber cable 276, together, may comprise the laser.

As described supra, during processing of a new substrate 202 within the process chamber 200, the substrate 202 may be loaded onto the lift pins 232 by the robot, and the susceptor 206 may then be actuated up to the processing position to place the substrate 202, with its device side 250 facing up. The lift pins 232 include an enlarged head allowing the lift pins 232 to be suspended in openings by the susceptor 206 in the processing position. The high-energy radiant source assembly 270 may provide localized heating to eliminate cold spots due to the lift pins 232. As such, the high-energy radiant source assembly 270 may focus a beam of the light to between about 2 mm and about 20 mm, for example to about 10 mm. In some embodiments, the high-energy radiant source assembly 270 may focus the light beam while the substrate 202 is rotating within the process chamber 200. Heating from the laser beam may cause a reduction in the resistivity (Rs) profile of the implant substrate 202 when annealed, as an increase in temperature lowers resistivity.

In order to locally heat and/or tune specific areas of the substrate, for example, areas coupled to and/or near the lift pins 232, the high-energy radiant source assembly 270 may be directed to proper locations and operated at specific timings. In certain embodiments, by way of example only, the lift pins 232 operate at about 32 RPM and move at a speed of about 380 mm/s. In order to achieve less than 1 mm accuracy, timing control is calculated to be less than about 2.5 ms. In some embodiments, focusing of the light may be performed at specific timing intervals. In other embodiments, a shutter with a speed similar to the speed of the susceptor 206 may be utilized as necessary. In some embodiments, a laser with a 6 microsecond raise time may be utilized.

In some embodiments, the high-energy radiant source assembly 270 may provide a pulsed light beam such that the high-energy radiant source assembly 270 is on and functioning 0.5 ms before the lift pin 232 is in contact with the substrate 202. It is contemplated that other time intervals may be utilized. In some embodiments, the high-energy radiant source assembly 270 may be turned off 0.5 ms after the substrate passes the light of the high-energy radiant source assembly 270.

It is further contemplated that multiple high-energy radiant source assemblies 270 may be utilized within the process chamber 200. Furthermore, in some embodiments, a source head 272 on a moveable track may be utilized to ensure appropriate tuning of the substrate 202. The moveable track may allow the source head 272 to sweep across the substrate 202, thus allowing for gross adjustments in a predetermined pattern. In such an embodiment, the source head 272 may move from the outer circumference radially inward, however other embodiments, such as movement from the origin radially outward, etc.

To trigger the high-energy radiant source assembly 270 at the proper time (i.e., when the substrate 202 is passing an acceptable location), the high-energy radiant source assembly 270 is turned to the on position when the lift pin 232 is approximately in line with and/or at the focus position. As such, the motion of the lift pin 232 is synchronized with the high-energy radiant source assembly 270.

In one embodiment, a flag may be built on the susceptor 206 to indicate the location of the lift pin 232. The flag may have a width of between about 0.1 degree and about 1.0 degree. The flag may be machined and/or may be mounted to or coupled to the susceptor 206. In certain embodiments, a delay in the flag signal may be introduced to ease the mounting or coupling tolerance. The delay may be adjusted in order to improve accuracy of the high-energy radiant source assembly 270, thus improving accuracy of the light with respect to the locations of the lift pins 232.

In some embodiments, the flag may be a homing flag and/or an optical sensor. The flag may trigger an optical switch associated with a home location on the substrate 202. In certain embodiments, the flag may be machined into or coupled to the rotation assembly, such as the susceptor.

In another embodiment, a rotation encoder may be utilized to sync the high-energy radiant source assembly 270. In some embodiments, the encoder may be a range based encoder. The encoder may me controlled by a controller 250, described infra. The encoder may have about a 0.03 degree resolution or better in order to achieve less than 1 mm accuracy, and may be pulled at less than, in some embodiments, for example, 2.5 ms. In other embodiments, the encoder may be pulled at a rate of 1 ms.

In another embodiment, an imaging process may be used to detect features on the susceptor 206 and predict when to fire the high-energy radiant source assembly 270. The imaging process may be completed with less than a 2.5 ms turnaround time. As such, an algorithm may be determined and controlled by the controller 250 to predict and/or determine when to fire the high-energy radiant source assembly 270.

The above-described process chamber 200 can be controlled by a processor based system controller, such as controller 250, shown in FIGS. 2 and 3. For example, the controller 250 may be configured to control flow of various precursor and process gases and purge gases from gas sources, during different operations of a substrate process sequence. By way of further example, the controller 250 may be configured to control a firing of the high-energy radiant source assembly 270, predict an algorithm for firing the high-energy radiant source assembly 270, control operation of the flag and/or flag signal, and/or encode or sync the high-energy radiant source assembly 270, among other controller operations. The controller 250 includes a programmable central processing unit (CPU) 252 that is operable with a memory 255 and a mass storage device, an input control unit, and a display unit (not shown), such as power supplies, clocks, cache, input/output (I/O) circuits, and the like, coupled to the various components of the process chamber 200 to facilitate control of the substrate processing. The controller 250 also includes hardware for monitoring substrate processing through sensors in the process chamber 200, including sensors monitoring the precursor, process gas and purge gas flow. Other sensors that measure system parameters such as substrate temperature, chamber atmosphere pressure and the like, may also provide information to the controller 250.

To facilitate control of the process chamber 200 described above, the CPU 252 may be one of any form of general purpose computer processor that can be used in an industrial setting, such as a programmable logic controller (PLC), for controlling various chambers and sub-processors. The memory 255 is coupled to the CPU 252 and the memory 255 is non-transitory and may be one or more of readily available memory such as random access memory (RAM), read only memory (ROM), floppy disk drive, hard disk, or any other form of digital storage, local or remote. Support circuits 258 are coupled to the CPU 252 for supporting the processor in a conventional manner. Charged species generation, heating, and other processes are generally stored in the memory 255, typically as a software routine. The software routine may also be stored and/or executed by a second CPU (not shown) that is remotely located from the hardware being controlled by the CPU 252.

The memory 255 is in the form of computer-readable storage media that contains instructions, that when executed by the CPU 252, facilitates the operation of the process chamber 200. The instructions in the memory 255 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 6:
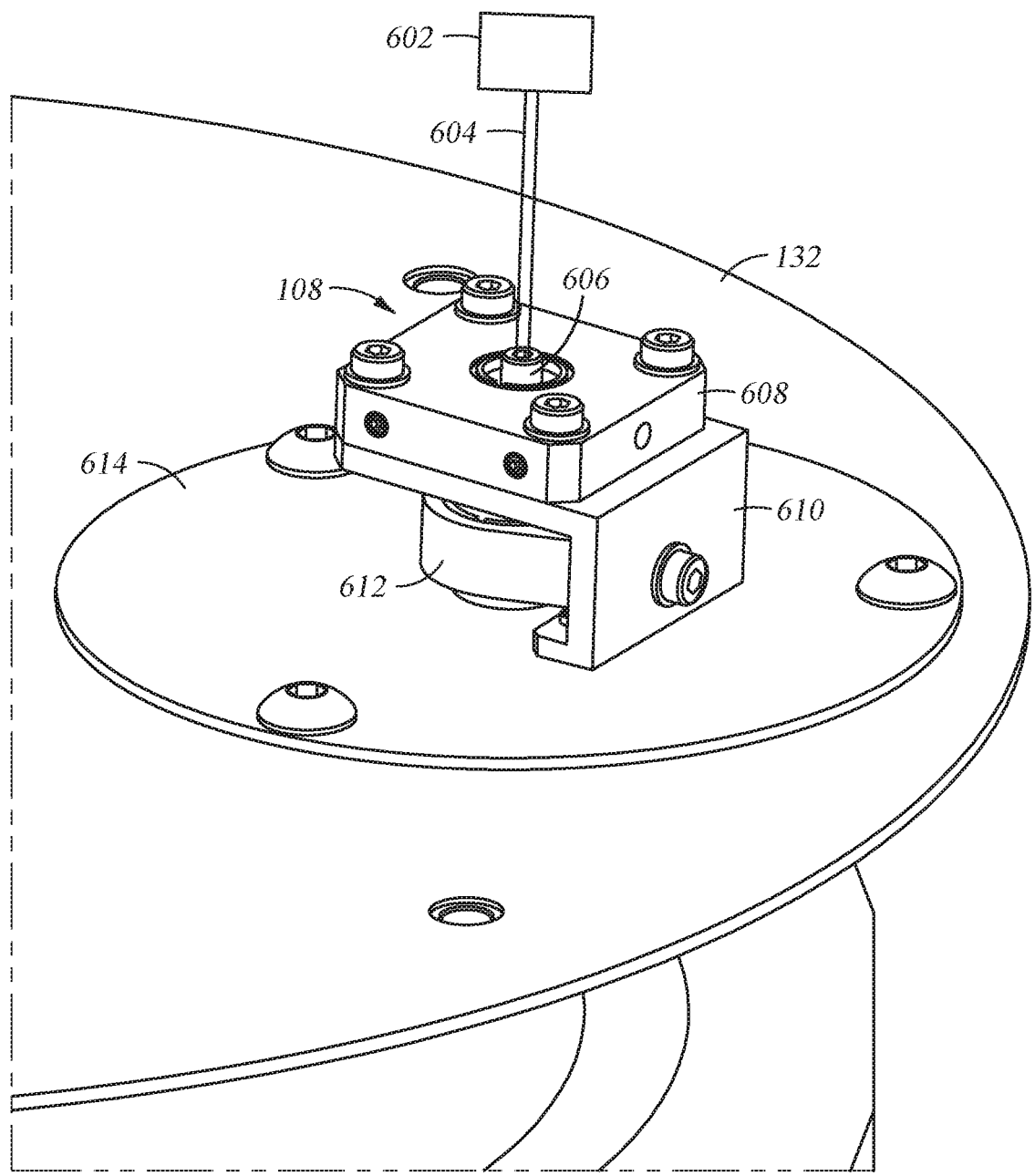
FIG. 6 is a schematic perspective view of the high-energy radiant source assembly according to one embodiment.

FIG. 6 is a perspective view of the high-energy radiant source assembly 108 (FIG. 1) according to one embodiment. As shown in FIG. 6, one high-energy radiant source assembly 108 of the one or more assemblies 108 may include a high-energy radiant source 602 and a bracket 610 for supporting components of the high-energy radiant source assembly 108. The high-energy radiant source assembly 108 may further include a cage plate 608 disposed on the bracket 610 for securing a fiber connector 606. In one embodiment, the high-energy radiant source 602 is connected to the fiber connector 606 via a fiber 604. The high-energy radiant source 602 may be any suitable high-energy radiant source for producing radiant energy, such as focused radiant energy, at a power capable of increasing the temperature of the substrate 110 (FIG. 1) by 2-5 degrees Celsius during a deposition process, such as an epitaxial deposition. The focused high-energy may have a wavelength in the visible range. In one embodiment, the high-energy radiant source 602 is a laser source including two laser diodes each having at least 50 W output power for a total output power of at least 100 W and a wavelength of about 810 nm. In one embodiment, the high-energy radiant source 602 is a vertical cavity surface emitting laser (VCSEL) including 33 chips in series having a total output power of 264 W (each chip has an output power of 8 W). The length of the fiber 604 may be about 15 m. In one embodiment, instead of coupling the high-energy radiant beam to the fiber 604, the high-energy radiant source 602 is disposed on the bracket 610.

Figure 7:
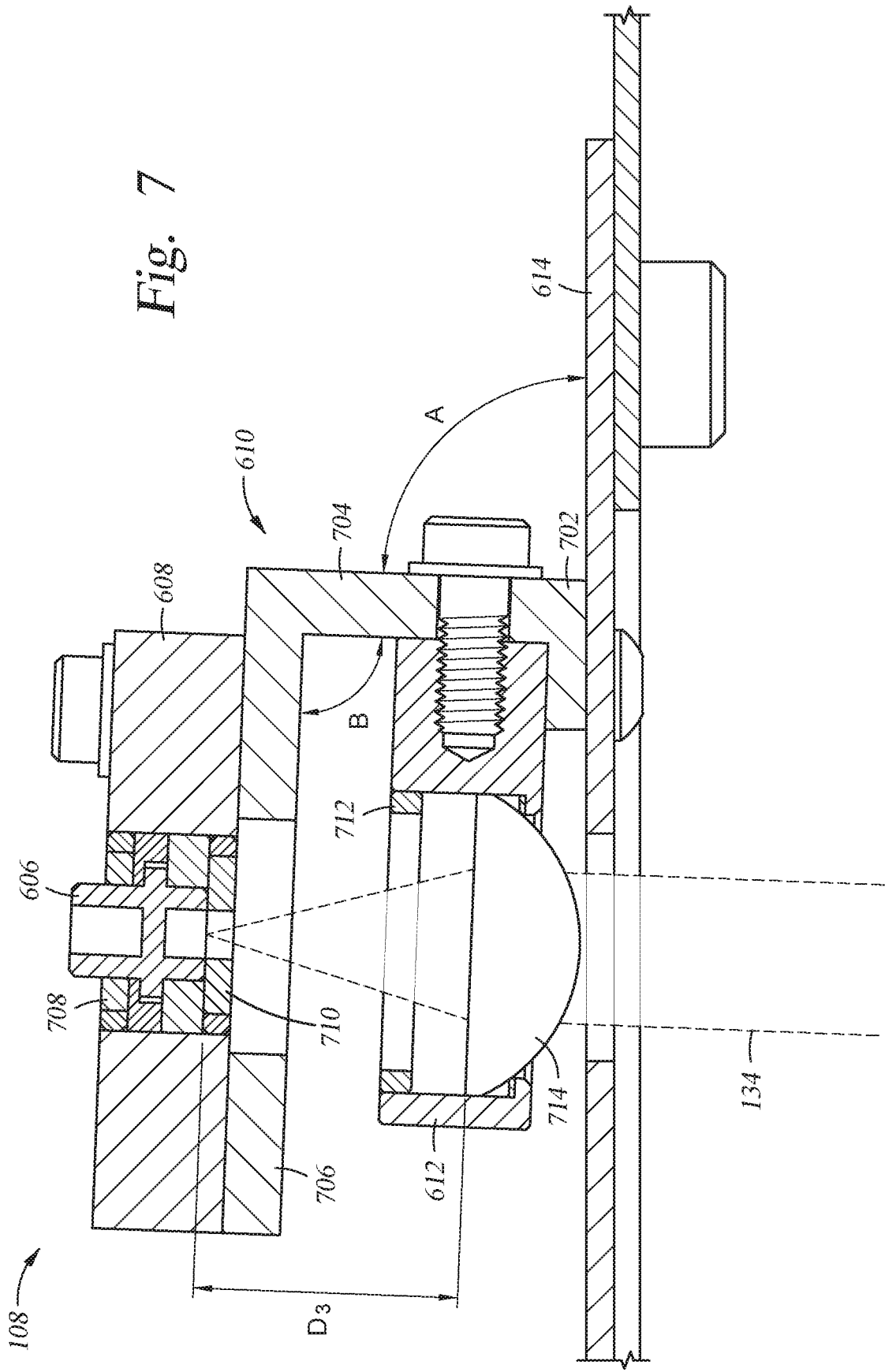
FIG. 7 is an enlarged schematic cross sectional side view of the high-energy radiant source assembly of FIG. 6 according to one embodiment.

The high-energy radiant source assembly 108 may further include an optic holder 612 for holding one or more lenses, such as an aspheric lens (FIG. 7). The high-energy radiant source assembly 108 may be disposed on a support block 614 that is bolted to the support member 132. Alternatively, the high-energy radiant source assembly 108 may be disposed on a track along a radial direction of the substrate 110 (FIG. 8).

FIG. 7 is an enlarged schematic cross sectional side view of the high-energy radiant source assembly 108 according to one embodiment. As shown in FIG. 7, the cage plate 608 may include two retainer rings 708, 710 for securing the fiber connector 606. The optic holder 612 may include a retainer ring 712 for securing a lens 714, such as an aspheric lens. The bracket 610 may include a first portion 702 coupled to the support block 614, a second portion 704 at an angle A with respect to the first portion 702, and a third portion 706 at an angle B with respect to the second portion 704. The optic holder 612 may be coupled to the second portion 704 and the cage plate 608 may be coupled to the third portion 706. In one embodiment, the angle B is about 90 degrees and the angle A is either an acute or obtuse angle that is not 90 degrees so the second portion 704 is not substantially perpendicular to the surface 122 of the substrate 110 (FIG. 1). In one embodiment, the angle A is about 92 degrees and the angle B is about 90 degrees, so the lens 714 has a 2° tilt with respect to the third portion 706 to prevent back reflections into the fiber 604 which could damage the high-energy radiant source 602. Alternatively, the angle A is about 90 degrees and the angle B is either an acute or obtuse angle that is not 90 degrees. The acute or obtuse angle A or B can be used to determine the location on the substrate 110 of the beam spot of the one or more high-energy radiant beams 134. In one embodiment, the first, second, and third portions 702, 704, 706 are a single piece of material, and the angles A, B are set and are not adjustable. In another embodiment, the first, second, and third portions 702, 704, 706 are made of different pieces of materials, and the angles A, B can be adjusted.

In one embodiment, the high-energy radiant beam, such as a focused high-energy radiant beam, for example a laser beam, out of the fiber 604 has a diameter of about 800 micrometers that is re-imaged onto the substrate 110 at 17× magnification by the lens 714, so the beam spot on the substrate 110 has a diameter of about 10 mm. In one embodiment, the laser beam out of the fiber exits at a divergence of about 0.17 NA. The distance $D_3$ one focused high-energy radiant beam 134 of the one or more beams 134 travels from the fiber connector 606 to the lens 714 is about 18 mm. The transparent material of the first dome 112 (FIG. 1) may cause a slight shift of the beam spot on the substrate which can be compensated by adjusting the angle A or B. A small percentage of the high-energy radiant beam may be reflected by the first dome 112. In one embodiment, about 7 W of power is reflected by the first dome and the total output power of the high-energy radiant beam 134 is about 90 W.

Figure 8:
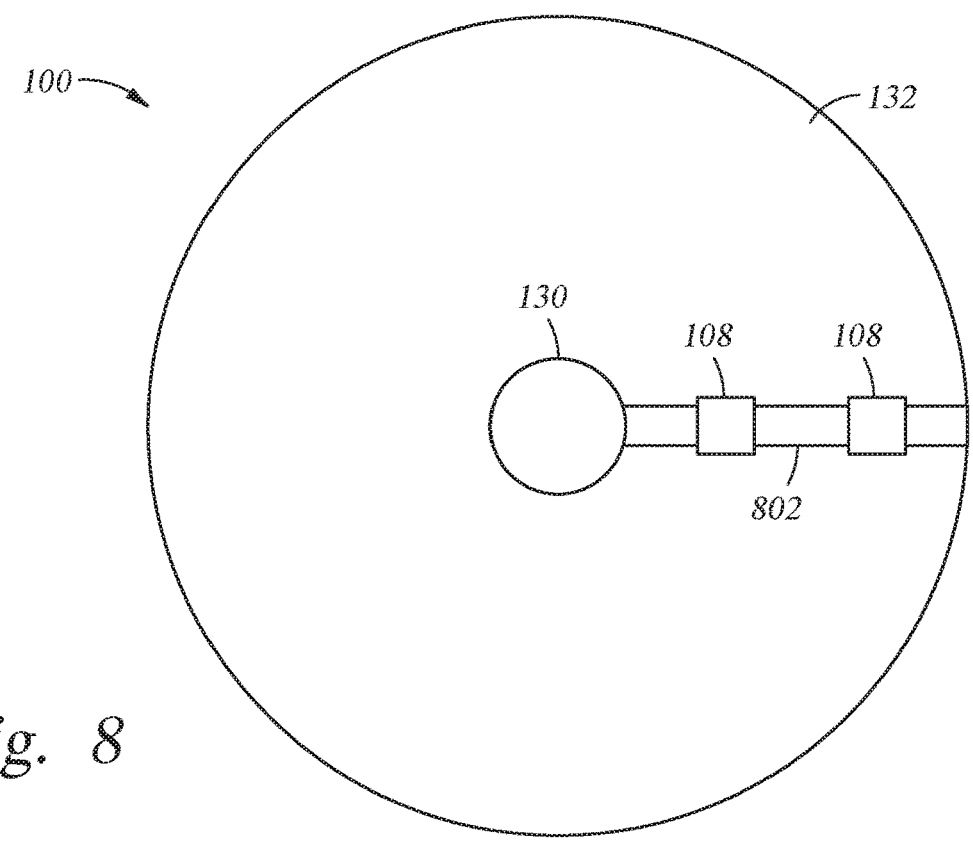
FIG. 8 is a schematic top view of the process chamber of FIG. 1 according to one embodiment.

FIG. 8 is a schematic top view of the process chamber 100 of FIG. 1 according to one embodiment. As shown in FIG. 8, the process chamber 100 includes the one or more temperature sensors 130 supported by the support member 132. A track 802 may be formed on the support member 132 in a radial direction, and the one or more high-energy radiant source assemblies 108 may be movably disposed on the track 802. The one or more high-energy radiant source assemblies 108 may be moved during or between processes in order to provide localized heating of various regions on the substrate 110. As shown in FIG. 8, there are two high-energy radiant source assemblies 108 disposed on the track 802 for simultaneously heating cold regions on the substrate 110. In some embodiments, one high-energy radiant source assembly 108 is disposed on the track 802. In some embodiments, more than two high-energy radiant source assemblies 108 are disposed on the track 802.

Figure 9:
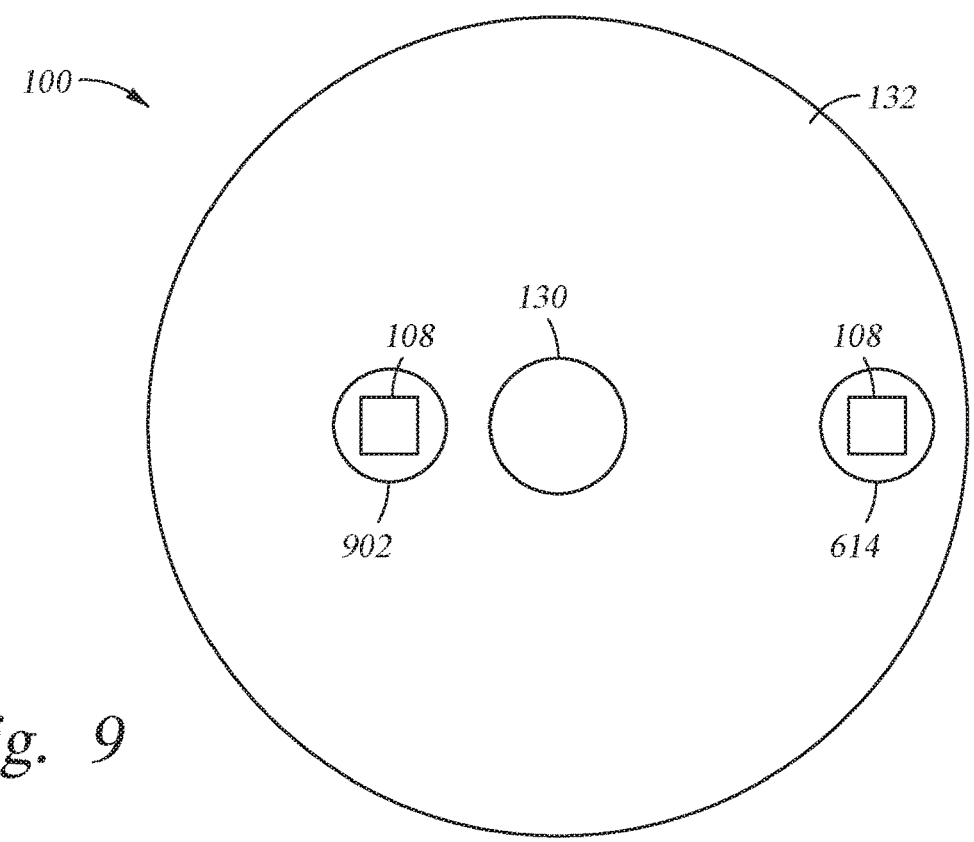
FIG. 9 is a schematic top view of the process chamber of FIG. 1 according to another embodiment.

FIG. 9 is a schematic top view of the process chamber 100 of FIG. 1 according to one embodiment. As shown in FIG. 9, one high-energy radiant source assembly 108 is disposed on the support block 614 and a second high-energy radiant source assembly 108 is disposed on a support block 902. The support blocks 614, 902 may be disposed at different radial positions on the support member 132 to simultaneously heat different radial regions of the substrate 110. Again in some embodiments, one high-energy radiant source assembly 108 is utilized, and in some embodiments, more than two high-energy radiant source assemblies 108 are utilized.

Figure 10:
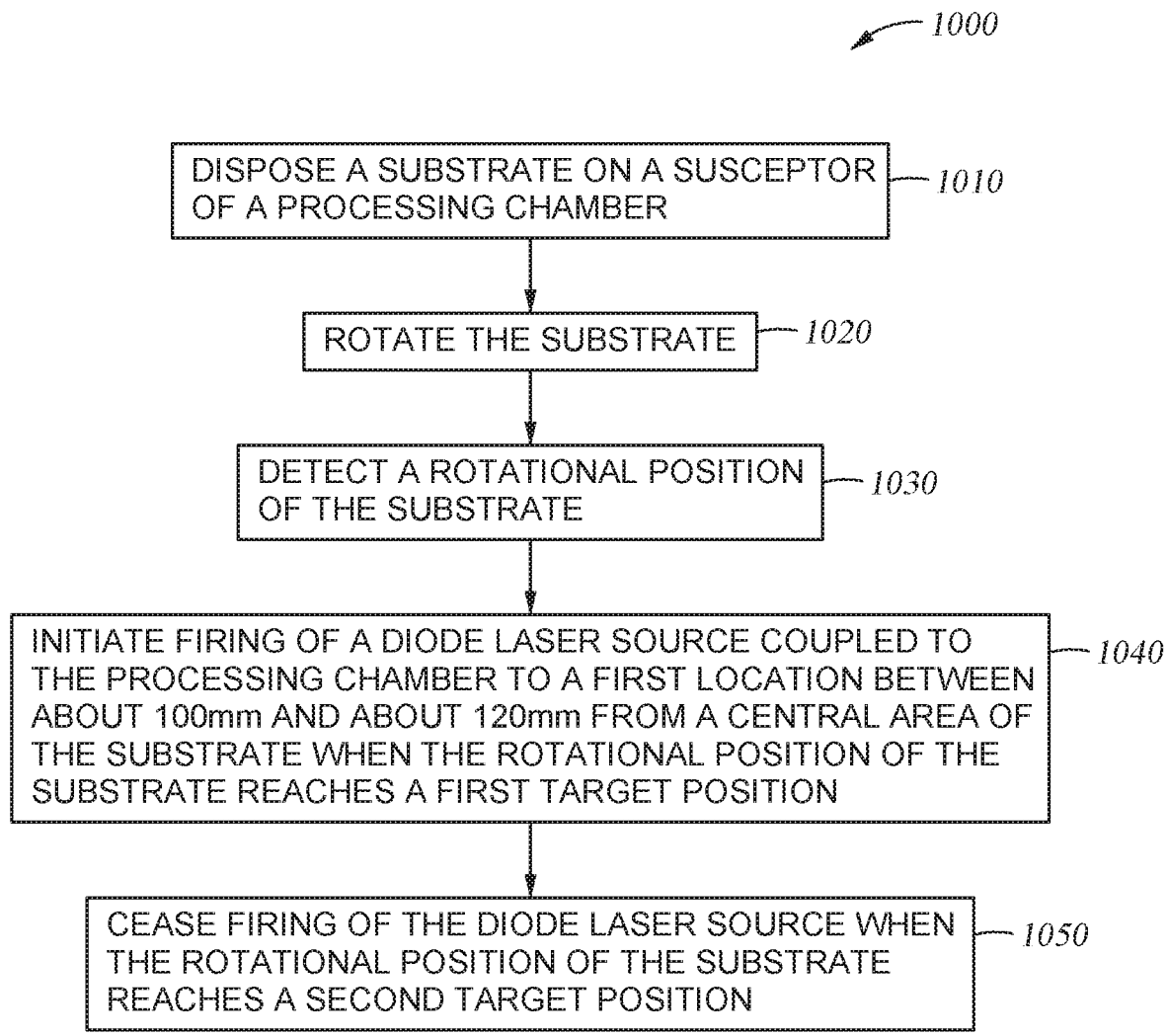
FIG. 10 illustrates operations of a method for processing a substrate according to embodiments described herein.

FIG. 10 schematically illustrates operations of a method 1000 for processing a substrate. In some embodiments, the method 1000 may locally heat the substrate in an epitaxial deposition chamber.

At operation 1010 a substrate is disposed on a susceptor of a process chamber. In some embodiments, the process chamber may be an epitaxy deposition chamber. The process chamber may be the process chamber 100 or the process chamber 200. At operation 1020, the substrate is rotated.

At operation 1030, a rotational position of the substrate is detected. The rotational position of the substrate may be received by a controller and/or a sensor, which may be a camera or equivalent, or a thermal sensor. The rotational position may indicate the location and/or positioning of the substrate and/or the location and/or positioning of the susceptor within the processing chamber. The rotational position may also indicate the speed and/or timing of the substrate and/or susceptor within the processing chamber.

At operation 1040, when the rotational position of the substrate reaches a first target position, firing of a high-energy source, such as a laser source, is initiated. The laser source may be a diode laser source. The high-energy source is coupled to the process chamber to a first location between about 100 mm and about 120 from a central area of the substrate. The laser firing may be initiated from the diode laser source. The laser firing may last for any length of time and may be, in certain embodiments a constant firing and/or a pulsed firing. The firing of the laser may heat an area, portion, or specific region of the substrate, as described supra. Furthermore, firing the diode laser source may divert the light from the diode laser source to the first region of the chamber may allow the light from the laser source to tune and/or heat the first region. In some embodiments, the first region of the chamber may include an area of a substrate coupled to a lift pin of the chamber. As such, the light may tune and/or heat the area of the substrate coupled to the lift pin in order to reduce a cold spot thereon. It is further contemplated that other types of lasers or laser sources may be utilized, for example a fiber laser, among others.

At operation 1050, when the rotational position of the substrate reaches a second target position, firing of the high-energy source is ceased. The second target position may be received based on a rotational positioning of the susceptor and/or a rotational positioning of the substrate.

The second target position may be received by the controller and/or a sensor. The second target position may indicate the location and/or positioning of the substrate and/or the location and/or positioning of the susceptor within the processing chamber. The second target position may also indicate the speed and/or timing of the substrate and/or susceptor within the processing chamber. The method 1000 may be repeated as the substrate and/or the susceptor is further rotated within the processing chamber.

Figure 11:
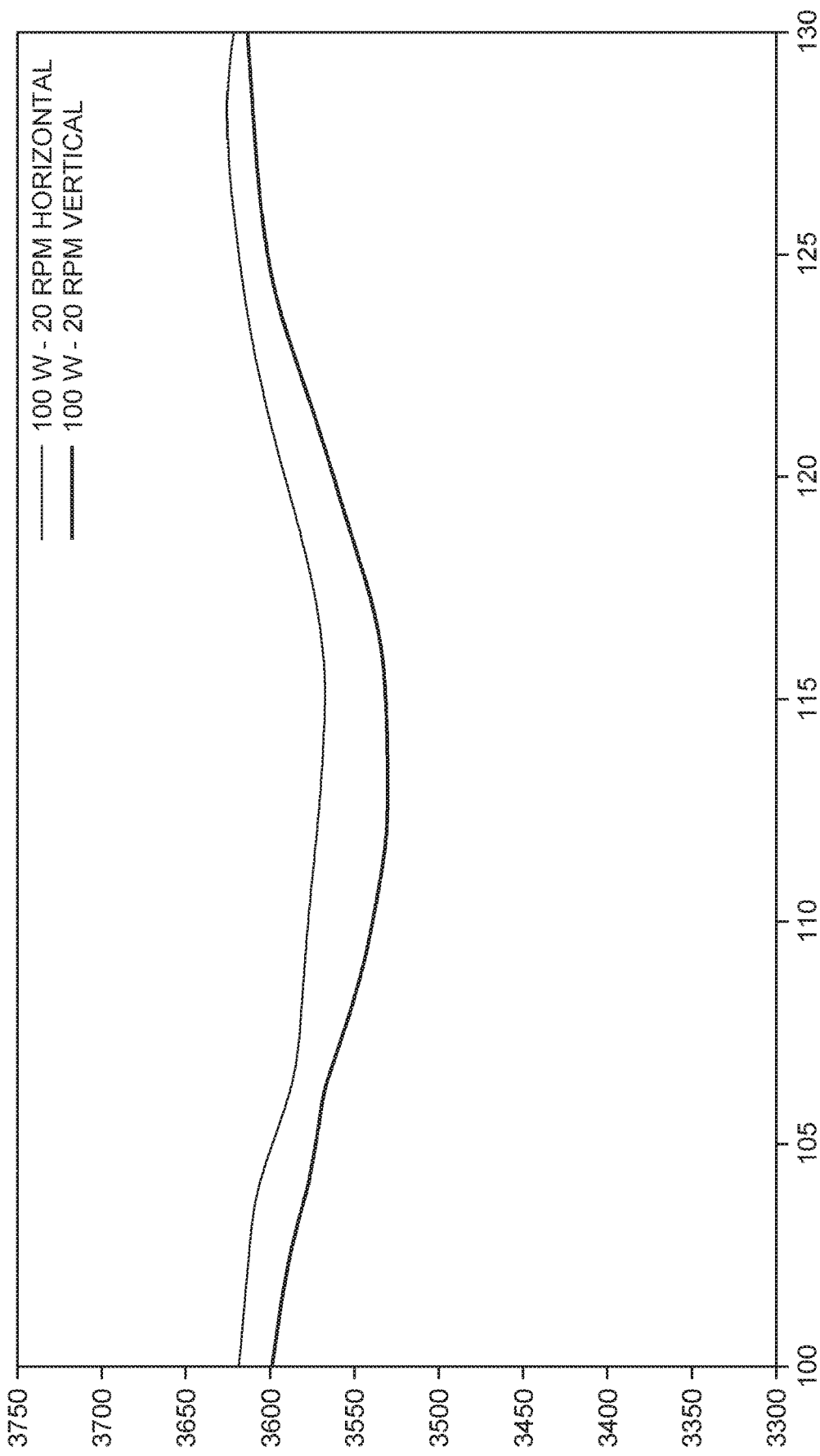
FIG. 11 illustrates a data plot providing test results for distance from origin of the substrate versus resistivity of the substrate.

Testing was performed and results indicated that with a utilization of the apparatus and methods described herein at between about 105 mm and about 120 mm from a center of the substrate within the process chamber, the substrate is optimally tuned, as the dip in resistivity is reduced, and cold spots on the substrate are appropriately compensated for, as shown in FIG. 11. As such, located spot and area heating is applied to the substrate via the high-energy radiant source assembly in order to control the amount of energy going to the substrate. Certain and specific areas of the substrate may be tuned as the substrate rotates within the process chamber, thus alleviating a trough in the substrate profile and raising the profile of the substrate, as the high-energy radiant source assembly causes a narrow band of power to perform the localized heating.

Benefits of the present disclosure include a reduction in the number of cold spots associated with a substrate. Reducing the temperature non-uniformities within a substrate further creates a substrate with a more uniform surface. A cost reduction is also realized in that there is an increase in substrate quality. Additional benefits include precise local heating of the substrate for ultra-fine tuning of temperature uniformity.

In summation, embodiments described herein provide an epitaxial deposition chamber which includes a high-energy radiant source assembly for providing localized heating of a substrate during processing. Energy may be focused to about a 10 mm area during substrate rotation within the chamber in order to locally heat and tune specific locations of the substrate, such as locations adjacent a lift pin, at specifically timed intervals. Energy from the high-energy beam may provide a dip in a resistivity profile of an implant substrate when annealed. The high-energy radiant source assembly may be a diode laser system positioned to direct energy at a region of a susceptor between about 100 mm and about 120 mm from a central area of the susceptor.

While the foregoing is directed to embodiments of the present disclosure, other and further embodiments of the disclosure may be devised without departing from the basic scope thereof, and the scope thereof is determined by the claims that follow.

The invention claimed is:

1. An epitaxial deposition process chamber, comprising:
   a first dome;
   a second dome;
   a substrate support disposed between the first dome and the second dome;
   a first plurality of heating lamps disposed over the first dome, wherein the first dome is disposed between the first plurality of heating lamps and the substrate support;
   a lid disposed over the first plurality of heating lamps;
   a cover plate disposed on the lid; and
   a radiant source assembly disposed above the cover plate and radially inward of each heating lamp of the first plurality of heating lamps, wherein the radiant source assembly comprises:
      a source head pointed at the substrate support;

a lens configured to focus one or more radiant beams from the source head into a beam having a diameter of between about 2 mm and about 10 mm adjacent the substrate support;
a bracket for coupling the source head to the cover plate, wherein an optical holder is coupled to the bracket and the optical holder is holding the lens; and
a cage plate disposed on the bracket, a fiber connector secured to the cage plate and an optical fiber coupled to the fiber connector.

2. The process chamber of claim 1, further comprising:
a second plurality of heating lamps disposed below the second dome, wherein the second dome is disposed between the substrate support and the second plurality of heating lamps,
a base ring disposed between the first dome and the second dome;
a motion assembly coupled to a shaft of the substrate support;
a plurality of lift pins disposed through the substrate support;
one or more temperature sensors disposed through the lid;
a process gas inlet disposed through the base ring;
a gas outlet disposed through the base ring on an opposite side of the base ring from the process gas inlet; and
a purge gas inlet disposed through the base ring and below the process gas inlet.

3. The process chamber of claim 1, wherein the radiant source assembly is configured to produce the one or more radiant beams and the source head is positioned to direct a radiant beam at an annular region of the substrate support between a radius of about 90 mm and about 130 mm from a central position of the cover plate to locally heat a cold region of a substrate.

4. The process chamber of claim 3, wherein the radiant source assembly comprises two laser diodes.

5. The process chamber of claim 3, wherein the radiant source assembly includes a vertical cavity surface emitting laser.

6. The process chamber of claim 1, wherein the radiant source assembly is capable of producing radiant energy having a wavelength in a visible range.

7. The process chamber of claim 1, wherein the radiant source assembly is capable of producing radiant energy having a wavelength of about 810 nm.

8. A process chamber, comprising:
a first dome;
a second dome;
a substrate support disposed between the first dome and the second dome;
a motion assembly coupled to a shaft of the substrate support;
a plurality of lift pins disposed through the substrate support;
a first plurality of heating lamps disposed over the first dome, wherein the first dome is disposed between the first plurality of heating lamps and the substrate support;
a lid disposed over the first plurality of heating lamps;
a cover plate disposed on the lid and over the first plurality of heating lamps, wherein the first plurality of heating lamps are disposed between the first dome and the cover plate;
a first radiant source assembly disposed above the cover plate and radially inward of each heating lamp of the first plurality of heating lamps, wherein the first radiant source assembly comprises:
a source head;
a bracket for coupling the source head to the cover plate, wherein an optical holder is coupled to the bracket and the optical holder is holding a lens; and
a cage plate disposed on the bracket, a fiber connector secured to the cage plate and an optical fiber coupled to the fiber connector; and
a controller configured to:
rotate the substrate support about an axis using the motion assembly;
detect a rotational position of a substrate;
initiate firing of the first radiant source assembly when the rotational position of the substrate reaches a first target position; and
cease firing of the first radiant source assembly when the rotational position of the substrate reaches a second target position.

9. The process chamber of claim 8, further comprising a second plurality of heating lamps disposed below the second dome, wherein the second dome is disposed between the substrate support and the second plurality of heating lamps:
a base ring disposed between the first dome and the second dome;
one or more temperature sensors disposed through the lid;
a process gas inlet disposed through the base ring;
a gas outlet disposed through the base ring on an opposite side of the base ring from the process gas inlet; and
a purge gas inlet disposed through the base ring and below the process gas inlet.

10. The process chamber of claim 8, wherein the first radiant source assembly further comprises a lens and an optic holder holding the lens, wherein the optic holder is coupled to the bracket.

11. The process chamber of claim 10, wherein the lens is an aspheric lens.

12. The process chamber of claim 8, wherein the bracket comprises a first portion coupled to the cover plate, a second portion and a third portion, wherein the first portion and the second portion form a first angle and the second portion and the third portion form a second angle, wherein the first angle is either an acute angle or an obtuse angle and the second angle is about 90 degrees.

13. The process chamber of claim 12, wherein the first angle is about 92 degrees.

14. The process chamber of claim 12, wherein the cage plate is disposed on the third portion of the bracket, the fiber connector is secured by a first retainer ring and a second retainer ring of the cage plate, and wherein the optical fiber is coupled to a high energy radiant source.

15. The process chamber of claim 1, further comprising a reflector member disposed between the cover plate and the first dome.

16. The process chamber of claim 15, further comprising a hole extending through the reflector member, the hole configured to have one or more radiant beams pass therethrough.

17. The process chamber of claim 8, further comprising a reflector member disposed between the cover plate and the first dome, wherein the reflector member comprises a hole extending through the reflector member, the hole configured to have one or more radiant beams pass therethrough.

18. The process chamber of claim 1, further comprising a controller configured to:
rotate the substrate support about an axis using a motion assembly;
detect a rotational position of a substrate using an encoder or a flag disposed on the substrate support;

initiate firing of the radiant source assembly when the rotational position of the substrate reaches a first target position; and cease firing of the radiant source assembly when the rotational position of the substrate reaches a second target position.

19. The process chamber of claim 18, wherein the firing of the radiant source assembly heats an area of the substrate disposed above a lift pin.

20. The process chamber of claim 8, wherein the substrate support includes a flag disposed thereon to indicate a location of one or more of the lift pins.

* * * * *